(12) United States Patent  
Thompson et al.

(10) Patent No.: US 11,131,922 B2
(45) Date of Patent: Sep. 28, 2021

(54) IMPRINT LITHOGRAPHY TEMPLATE, SYSTEM, AND METHOD OF IMPRINTING

(71) Applicant: CANON KABUSHIKI KAISHA, Tokyo (JP)

(72) Inventors: Ecron D. Thompson, Round Rock, TX (US); Andrew Robert Eckert, Pflugerville, TX (US); Kosta S. Selinidis, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 284 days.

(21) Appl. No.: 15/174,166

(22) Filed: Jun. 6, 2016

(65) Prior Publication Data

US 2017/0351171 A1  Dec. 7, 2017

(51) Int. Cl.
*G03F 7/00* (2006.01)

(52) U.S. Cl.
CPC .................. *G03F 7/0002* (2013.01)

(58) Field of Classification Search
None
See application file for complete search history.

(56) References Cited

U.S. PATENT DOCUMENTS

| | | | |
|---|---|---|---|
| 6,873,087 B1 | 3/2005 | Choi et al. | |
| 8,647,106 B2 | 2/2014 | Inanami et al. | |
| 2004/0189996 A1 | 9/2004 | Sreenivasan et al. | |
| 2006/0062867 A1* | 3/2006 | Choi | B29C 35/0888 425/174.4 |
| 2006/0266244 A1* | 11/2006 | Kruijt-Stegeman | B41F 1/18 101/485 |
| 2008/0199816 A1* | 8/2008 | Choi | B82Y 10/00 430/322 |
| 2009/0086187 A1 | 4/2009 | Compen et al. | |
| 2009/0147237 A1* | 6/2009 | Schumaker | B82Y 10/00 355/72 |
| 2011/0017168 A1 | 1/2011 | Gilpatrick | |
| 2011/0192302 A1 | 8/2011 | Selinidis | |
| 2012/0269972 A1* | 10/2012 | Khusnatdinov | G03F 7/0002 427/277 |
| 2015/0111393 A1 | 4/2015 | Ishikura et al. | |

FOREIGN PATENT DOCUMENTS

EP    1801650 A2    6/2007

OTHER PUBLICATIONS

Nianhua Li, Wei Wu, and Stephen Y Chou : "Sub-20-nm Alignment in Nanoimprint Lithography Using Moiré Fringe", Nano Letters vol. 6, No. 11, p. 2626-2629, 2006.*

* cited by examiner

*Primary Examiner* — Matthew J Daniels
*Assistant Examiner* — Mohammad M Ameen
(74) *Attorney, Agent, or Firm* — Abel Schillinger, LLP

(57) ABSTRACT

An imprint lithography template including an alignment mark including at least two columns or at least two rows of features spaced apart from one another, and a dummy-fill region, wherein the alignment mark is spaced apart from the dummy-fill region, and wherein a closest distance between the at least two columns or the at least two rows is less than a closest distance between any portion of the at least two columns or the at least two rows and the dummy-fill region. In an embodiment, the at least two columns or the at least two rows are spaced apart by at least 0.5 microns. In a further embodiment, the closest distance between the at least two columns or the at least two rows and the dummy-fill region is at least 2 microns.

14 Claims, 3 Drawing Sheets

IMPRINT LITHOGRAPHY TEMPLATE, SYSTEM, AND METHOD OF IMPRINTING

FIELD OF THE DISCLOSURE

The present disclosure relates to a nanoimprint lithography template.

RELATED ART

Imprint lithography processes are capable of forming nanometer scale patterns on substrates and can be used in the fabrication of semiconductor devices. In such processes, a formable material, such as an imprint resist or resin, is positioned between the substrate and a patterned template (or mold) and then cured to form a solid, patterned layer on the substrate.

Alignment of the template to the desired field location on the substrate occurs during the time in which the template and formable material are into contact and prior to curing of the material. Alignment marks are provided on the template for such alignment. However, it has been observed that the filling of such alignment marks with the formable material occurs slower than the filling of other patterned areas of the template, leading to lower throughput and/or the introduction of related defects. There is a need to address the relatively slow fill speed of alignment marks without causing another issue that slows or otherwise negatively impacts the imprint process.

SUMMARY OF THE INVENTION

In one aspect, an imprint lithography template comprises an alignment mark including at least two columns or at least two rows of features spaced apart from one another; and a dummy-fill region, wherein the alignment mark is spaced apart from the dummy-fill region, and wherein a closest distance between the at least two columns or the at least two rows is less than a closest distance between any portion of the at least two columns or the at least two rows and the dummy-fill region.

In an embodiment, the alignment mark is disposed within a region of the lithography template that corresponds to a scribe line of a substrate.

In another embodiment, the at least two columns or the at least two rows are spaced apart by at least 0.5 microns.

In a further embodiment, the closest distance between the at least two columns or the at least two rows and the dummy-fill region is at least 2 microns.

In another embodiment, the dummy-fill region surrounds the alignment mark.

In a further embodiment, the features comprise recessions within the lithography template, wherein the alignment mark further comprises a protrusion, and wherein a portion of the protrusion is disposed between the at least two columns or at least two rows of features and between at least one of the at least two columns or at least two rows of features and the dummy-fill region.

In yet another embodiment, the alignment mark further comprises a locator mark including at least one structure having a length lying along a line parallel with a length of at least one of the at least two columns or the at least two rows of features.

In another embodiment, a ratio $[D_C:D_D]$ of a distance between the at least two columns or the at least two rows, $D_C$, and a distance between the alignment mark and the at least two columns or the at least two rows and the dummy-fill, $D_D$, is between 1:2 and 1:5.

In another aspect, an imprint lithography template comprises: an alignment mark including at least two columns or at least two rows of features spaced apart from each other by at least 0.5 microns; and a dummy-fill region surrounding the alignment mark, wherein a closest spacing between the alignment mark and the dummy region is at least 2 microns.

In an embodiment, the at least two columns or at least two rows of features are spaced apart from each other by at least 2 microns.

In another embodiment, a closest spacing between the alignment mark and the dummy region is at least 5 microns.

In a further embodiment, the alignment mark further comprises a locator mark including at least one structure having a length lying along a line parallel with a length of at least one of the at least two columns or the at least two rows of features, and wherein the locator mark is disposed within a different portion of a same protrusion of the lithography template as the at least two columns or the at least two rows of features.

In another embodiment, the alignment mark is disposed within a region of the imprint lithography template that corresponds to a scribe line of a substrate.

In yet another embodiment, the features include a plurality of projections and recessions.

In another embodiment, the at least two columns or at least two rows of features includes three columns spaced apart from one another by at least 1 micron.

In another aspect, a method of forming a patterned surface along a substrate comprises: providing formable material on a substrate; providing a template having an alignment mark including at least two columns of features spaced apart from one another by at least 0.5 microns, wherein the alignment mark is spaced apart from a dummy-fill region by at least 2 microns; translating the template toward the substrate; and translating the template away from the substrate.

In an embodiment, the method further comprises exposing the formable material to ultraviolet light to cure the formable material prior to translating the template away from the substrate.

In an embodiment, the features of the at least two columns of features each include a recession or a protrusion.

In another embodiment, the formable material is fully patterned in less than 60% of a time required to fully pattern formable material using a template with a 0.5 micron distance between columns of features and dummy-fill region and no distance between adjacent columns.

In yet a further embodiment, the distance between the alignment mark and the dummy-fill region is at least 5 microns, wherein the distance between the at least two columns of features is at least 1 micron, or a combination thereof.

In another aspect, A method of forming an article comprises: providing an imprint apparatus having a substrate holder and a template holder having a template with an alignment mark including at least two columns of features spaced apart from one another by at least 0.5 microns, wherein the alignment mark is spaced apart from a dummy-fill region by at least 2 microns; placing a substrate on the substrate holder; providing formable material on the substrate; translating the template toward the substrate; and translating the template away from the substrate.

Other features and advantages of the present invention will be apparent from the accompanying drawings and from the detailed description that follows.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

Figure 1:
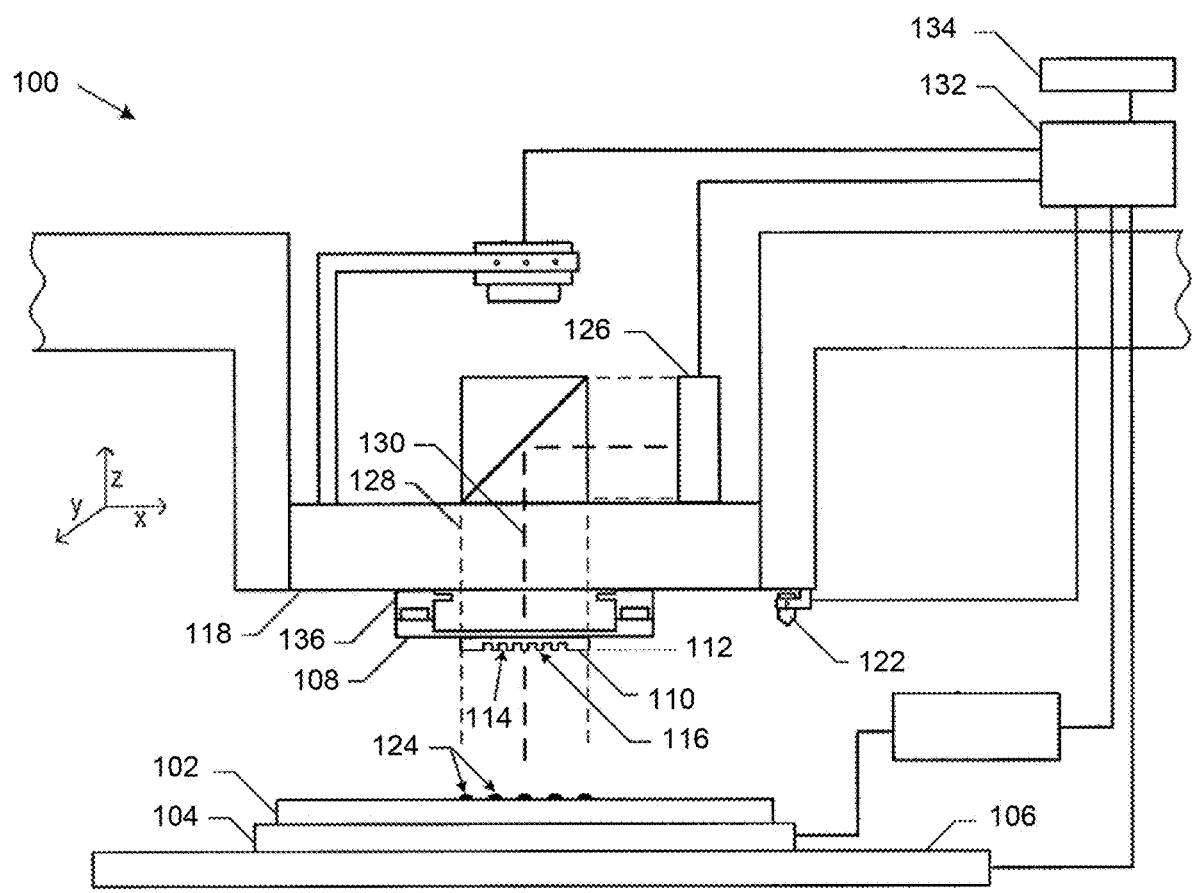
FIG. 1 includes a conceptual view of an imprint apparatus in accordance with an embodiment.

FIG. 1 illustrates a nanoimprint lithography system 100 that can be used to form a relief pattern on a substrate 102. The substrate 102 can be coupled to a substrate holder 104. The substrate holder 104 can include a vacuum chuck or any chuck including vacuum, pin-type, groove-type, electrostatic, electromagnetic, or the like. Exemplary chucks are described in U.S. Pat. No. 6,873,087, which is incorporated by reference herein in its entirety.

The substrate 102 and substrate holder 104 can be further supported by a stage 106. The stage 106 can provide translational motion, rotational motion, or both translation and rotational motion along the X-, Y-, and Z-axes. The stage 106, the substrate 102, and the substrate holder 104 may also be positioned on a base (not illustrated).

A template 108 is spaced-apart from the substrate 102. The template 108 can include a body having opposing sides with one of the opposing sides having a mold 110, which corresponds in size to a full field, having a patterning surface 112 extending therefrom towards the substrate 102. In an embodiment, the mold 110 can be in the form of a mesa. In another embodiment, the template 108 does not include the mesa.

In an embodiment, the template 108, the mold 110, or both the template 108 and the mold 110 are formed from a material including fused-silica, quartz, silicon, an organic polymer, a siloxane polymer, borosilicate glass, a fluorocarbon polymer, metal, hardened sapphire, another suitable material that can be molded, machined, or etched into a desired shape, or any combination thereof. As illustrated, the patterning surface 112 includes features defined by a plurality of spaced-apart recesses 114, protrusions 116, or any combination of recesses 114 and protrusions 116, though embodiments are not limited to such configuration. The patterned surface 112 defines a pattern that forms the basis of a corresponding pattern to be formed on the substrate 102.

In the illustrated embodiment, the template 108 is coupled to a template chuck 136. The template chuck 136 can be configured as a vacuum, pin-type, groove-type, electrostatic, electromagnetic, another suitable chuck type, or any combination thereof. Exemplary chucks are further described in U.S. Pat. No. 6,873,087. In the embodiment as illustrated, the template chuck 136 is coupled to an imprint head 118, such that the template chuck 136, the imprint head 118, or both the template chuck 136 and the imprint head 118 are configured to facilitate movement of the template 108 and the substrate 102 relative to each other. The imprint head 118 may be coupled to a frame 120.

The system 100 can further include a fluid dispense system 122 used to deposit a formable material 124 on the substrate 102. In a particular embodiment, the formable material can be a polymerizable material. In the embodiment as illustrated, the formable material 124 is positioned on the substrate 102 using a technique such as drop dispense, spin-coating, dip coating, chemical vapor deposition (CVD), physical vapor deposition (PVD), thin film deposition, thick film deposition, or any combination thereof. The formable material 124 is disposed on the substrate 102 before, after, or both before and after a desired volume is defined between the patterning surface 112 and the substrate 102, depending on design considerations.

The system 100 can further include an energy source 126 coupled to direct energy 128 along a path 130. The imprint head 118 and the stage 106 can be configured to position the template 108 and the substrate 102 in superimposition with the path 130. In the illustrated embodiment, the system 100 is controlled at least in part by a processor 132 in communication with the stage 106, the imprint head 118, the fluid dispense system 122, the energy source 126, or any combination thereof, and may operate on a computer readable program stored in a memory 134.

Figure 2:
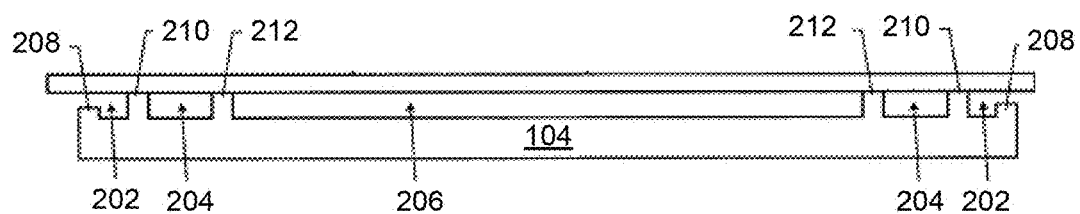
FIG. 2 includes an illustration of a cross-sectional view of a substrate overlying a chucking region of a substrate holder of the imprint apparatus of FIG. 1.

FIG. 2 includes an illustration of a portion of the substrate holder 104 that includes a chucking region and the substrate 102 to illustrate positional relationship between the chucking region and the substrate 102. The chucking region includes an outer zone 202, an intermediate zone 204, and a central zone 206, where the intermediate zone 204 is disposed between the outer zone 202 and the central zone 206. Each of the zones 202, 204, and 206 is defined in part by a recessed land 208 and full-height lands 210 and 212. In a particular embodiment, each of the lands 208, 210, and 212 are continuous, and thus, the lands 208, 210, and 212 are concentric. The outer zone 202 is laterally defined by the lands 208 and 210, the intermediate zone 204 is laterally defined by the lands 210 and 212, and the central zone 206 is laterally defined by the land 212. Within any one or more of the zones 208, 210, and 212, one or more pins (not illustrated) may be present to assist with support of the substrate 102, if needed or desired. In another embodiment, the recessed land 208 can be replaced by a full-height land.

Figure 3:
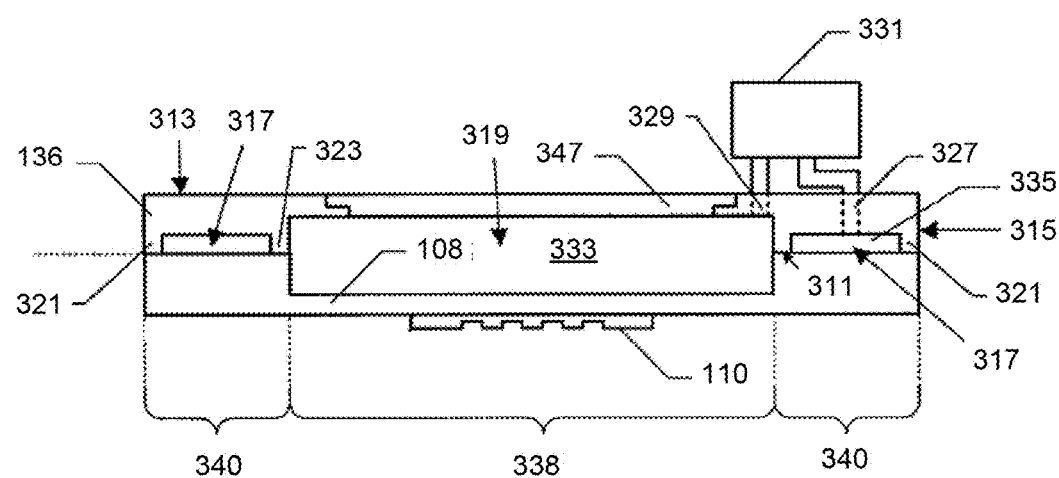
FIG. 3 includes an illustration of a cross-sectional view of a template held by a template holder of the imprint apparatus of FIG. 1.

Referring to FIGS. 1 and 3, the template 108 is coupled to the template chuck 136. The template chuck 136 includes opposing sides 311 and 313. A side, or edge, surface 315 extends between the opposing sides 311 and 313. The side 311 includes a recess 317 and a recess 319, spaced apart from the recess 317, defining spaced-apart support regions 321 and 323. The support region 321 cinctures support region 323 and the recesses 317 and 319. The support region 323 cinctures the recess 319. In a further embodiment, support regions 321 and 323 are formed from a compliant material. In a particular embodiment, the support region 321 has a square shape, and the support region 323 has a circular shape; however, in a further embodiment, the support regions 321 and 323 can include any geometric shape desired. A portion 347 of template chuck 136 is in superimposition with the recess 319 and can be transparent to radiation having a predetermined wavelength or a range of wavelengths. The portion 347 can include a thin layer of transparent material, such as glass. However, the material of the portion 347 may depend upon the wavelength of radiation emitted by the energy source. The portion 347 extends between the side 313 and terminates proximate to the recess 319. The portion 347 has an area at least as large as an area of mold 110 so that mold 110 is in superimposition therewith.

The template chuck 136 includes throughways 327 and 329. In an alternative embodiment, the template chuck 136 may have a different number of throughways. The throughway 327 places the recess 317 in fluid communication with the surface 313; however, in a further embodiment, the throughway 327 places the recess 317 in fluid communication with any surface of template chuck 136. The throughway 329 places the recess 319 in fluid communication with the side 313; however, in a further embodiment, the throughway 329 places the recess 319 in fluid communication with any surface of template chuck 136. The throughways 327 and 329 can facilitate placing the recesses 317 and 319, respectively, in fluid communication with a pressure control system, such as a pump system 331.

The pump system 331 may include one or more pumps to control the pressure proximate to the recesses 317 and 319. To that end, when the template 108 is coupled to the template chuck 136, the template 108 rests against the support regions 321 and 323, covering the recesses 317 and 319. A flexible region 338 of the template 108 may be in superimposition with the recess 319, defining a chamber 333 and a thicker region 340 of the template 108 may be in superimposition with recess 317, defining a chamber 335. The pump system 331 operates to control a pressure in the chambers 333 and 335.

Figure 4:
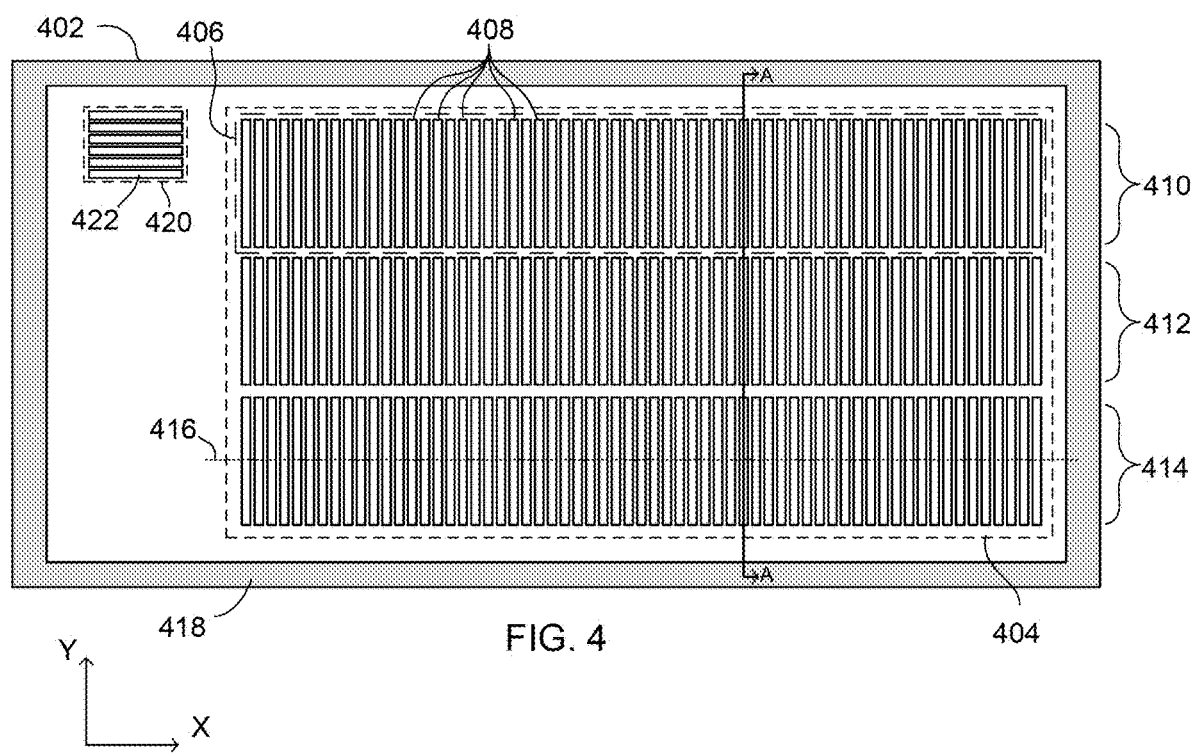
FIG. 4 includes a top view of a portion of a template having an alignment mark in accordance with an embodiment.

Ascertaining a desired alignment between template 108 and substrate 102 is important to accurately align the to-be-formed patterned layer over an existing pattern to achieve device functionality. Failure to properly align the template 108 and substrate 102 can result in a non-functional final device. FIG. 4 illustrates a template 402 including an alignment mark 404. The alignment mark 404 can be used for a field-by-field alignment process. During imprinting, the stage 106 and imprint head 118 can be moved such that the template 108 is oriented over a desired field of the substrate 102 based on coordinates stored in the memory 134. The desired field of the substrate 102 can include alignment marks that correspond to the alignment mark 404 on the template 108. The alignment mark 404 on the template 108 can then be aligned with alignment marks at a specific field being imprinted on the substrate 102 by evaluation of moiré patterns as described, for example, in U.S. Publication No. 2004/0189996, which is hereby incorporated by reference. Once the field is imprinted, the stage 106 can be moved to orient the template 108 over another field of the substrate. As such, alignment can be conducted within individual fields of the substrate 102. In order to obtain satisfactory alignment results, and properly functioning devices, the alignment marks need to be properly filled with formable material. The filling of the alignment time must occur in the time prescribed for the device manufacturing process.

In an embodiment, the alignment mark 404 can be disposed within a region of the template 402 corresponding to a scribe line or kerf region of the substrate 102. The alignment mark 404 can include at least two columns 406, at least two rows (not illustrated), or a combination of at least two columns 406 and at least two rows, spaced-apart from one another. As used herein, a "column" includes a plurality of features 408 arranged consecutively in the X-direction. The features 408 can include protrusions, recessions, or a combination of protrusions and recessions. The features 408 can be arranged such that a column center line 416 bisects all of the features 408 for a set of aligned features. As used herein, a "row" refers to a plurality of features 408 arranged along a bisecting line which intersects the bisecting line of one of the columns (i.e., in the Y-direction). In an embodiment, at least one of the rows is perpendicular to one of the columns 406. As used hereinafter, reference to columns 406 refers to either or both column and row arrangement.

In an embodiment, the alignment mark 404 can include at least three columns, at least four columns, or at least five columns. In a further embodiment, the alignment mark 404 may include no greater than eight columns, no greater than seven columns, or no greater than six columns. In another embodiment, the alignment mark 404 can include a number of columns 406 in a range between and including any of the numbers described above, such as between two columns and eight columns.

In the illustrated embodiment, the alignment mark 404 includes a first column 410, a second column 412, and a third column 414. The second column 412 is disposed between the first column 410 and the third column 414. The columns 410, 412, and 414 each include a plurality of features 408 having a substantially same length extending perpendicular to the bisecting column center line 416.

At a narrowest location, at least one of the first and second columns 410 and 412 or the second and third columns 412 and 414 are spaced apart from each another by at least 0.5 microns. In a more particular embodiment, at least one of the first and second columns 410 and 412 or the second and third columns 412 and 414 are spaced apart from one another by at least 1 micron or at least 2 microns. In an embodiment, the distance between adjacent columns 410, 412, and 414 is no greater than 3 microns. As illustrated, the distance between the first and second columns 410 and 412 can be the same as the distance between the second and third columns 412 and 414. Alternatively, the distance between the first and second columns 410 and 412 can be different than the distance between the second and third columns 412 and 414. As illustrated, the distance between at least two of the adjacent columns (e.g., 410 and 412 or 412 and 414) can be uniform along the length of the column. Alternatively, the distance between at least two of the adjacent columns can vary. In a particular instance, a minimum inter-column distance (i.e., the distance between adjacent columns) is no less than 0.5 microns.

As illustrated, the alignment mark 404 is surrounded by a dummy-fill region 418. The dummy-fill region 418 can include recessions or protrusions having the same, or similar, characteristics to the recessions and protrusions of the features 408. Alternatively, the dummy-fill region 418 can include recessions or protrusions having smaller pitch or different characteristics from the recessions or protrusions of the features 408. Inclusion of the dummy-fill region 418 can reduce strain incurred separating the template 108 from the substrate 102. The dummy-fill region 418 can further establish a uniform residual layer (not illustrated) across the imprint field while facilitating increased filling speed and control. Dummy-fill region 418 is not part of an active region of the device.

The alignment mark 404 can be spaced apart from the dummy-fill region 418. For example, as illustrated, the first, second, and third columns 410, 412, and 414 are all spaced apart from the dummy-fill region 418. The smallest distance between any point of the dummy-fill region 418 and the alignment mark 404 can be at least 2 microns. In a more particular embodiment, the smallest distance between any point of the dummy-fill region 418 and the alignment mark 404 is at least 5 microns. In another embodiment, the largest distance between any point of the dummy-fill region 418 and the alignment mark 404 is no greater than 50 microns, no greater than 15 microns, or no greater than 10 microns.

Figure 5:
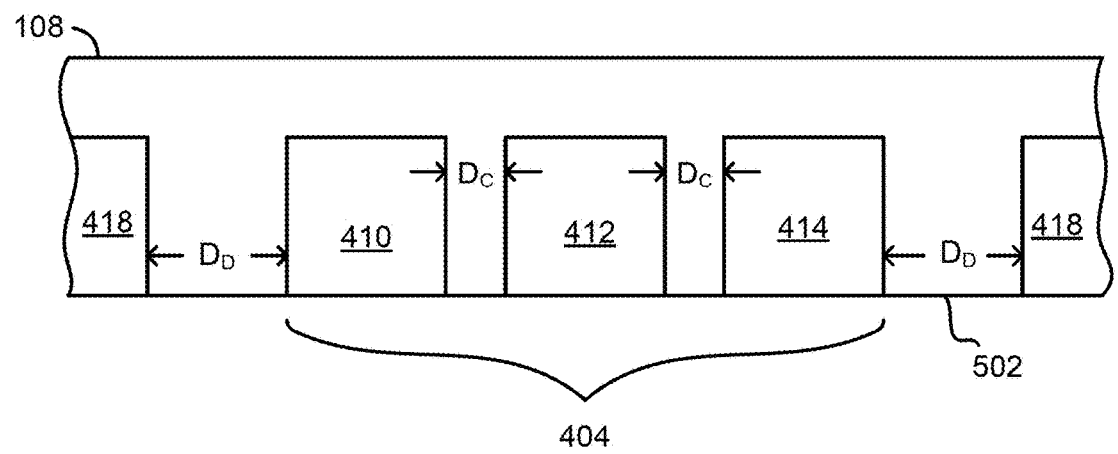
FIG. 5 includes an illustration of a cross-sectional view of a portion of a template having protrusions and recessions in accordance with an embodiment as seen along Line A-A in FIG. 4.

In a particular instance, the closest distance between adjacent columns 410, 412, and 414 of formable material along the substrate 502 is less than a closest distance between any portion of the alignment mark 404 and the dummy-fill region 418. Referring to FIG. 5, a ratio $[D_C:D_D]$ of the distance, $D_C$, between adjacent columns 410, 412, and 414 and the distance, $D_D$, between the alignment mark 404 and the dummy-fill region 418, can be in a range between and including 1:2 and 1:5, such as in a range between and including 1:2 and 1:4 or in a range between and including 1:3 and 1:5.

Inclusion of a distance between the dummy-fill region 418 and alignment mark 404 may reduce filling time of the alignment mark 404, particularly when the alignment mark features are oriented orthogonal to the dummy-fill feature direction. Use of orthogonally arranged dummy-fill features can guide the formable material past the adjacent features such as features 408 and thus lead to trapped gas in the places behind the material front. Trapped air can result in non-fully filled features 408, reducing both the functionality of the marks in performing alignment and the effectiveness of the subsequently formed article, such as an electronic device or mold. The above described distance between the first, second, and third columns 410, 412, and 414 as well as the distance between the alignment mark 404 and the dummy-fill region 418 have been found effective to reduce the formation of trapped air.

In an embodiment, a portion of the protrusion of the template 108 may be disposed between adjacent columns 410 and 412 or 412 and 414. In a further embodiment, another portion of the protrusion of the template 108 may be disposed between the alignment mark 404 and the dummy-fill region 418.

Referring again to FIG. 4, in order to provide suitable location for the region of interest for moiré fringes, the template 108 can further include a locator mark 420 which provides coarse registration. Locator mark 420 is generally located adjacent to one or more of the columns 410, 412, and 414. In an embodiment, the locator mark 420 is disposed within a different portion of a same protrusion of the template 108 as the columns 410, 412, and 414. That is, the locator mark 420 and alignment mark 404 can be contained within a same area of the template 108 surrounded by dummy-fill region 418. The locator mark 410 may be spaced apart from the dummy-fill region 418 by at least 2.5 microns, or even at least 5 microns.

The locator mark 420 may include at least one structure 422 having a length lying along a line parallel with a length of the columns 410, 412, and 414. The locator mark 420 may be formed of substantially similar material and in a similar manner as compared to the alignment mark 404.

The locator mark 420 can promote registration of location of the columns 410, 412, and 414 in situ and real time. As moiré fringes are typically unable to be determined with only the template 108, the locator mark 420 may provide proper locational alignment without any complimentary signal from the substrate 102 into the system 100. As such, the locator mark 420 may be able to provide a relative location of where the moiré fringes may be prior to fine alignment of the substrate 102 into the system 100 to the mask.

High volume manufacturing techniques benefit from templates having fast filling alignment marks. Filling speed is largely influenced by capillary forces of formable material. Traditional marks ignore boundary conditions and mark construction, resulting in partially unfilled marks.

Figure 6:
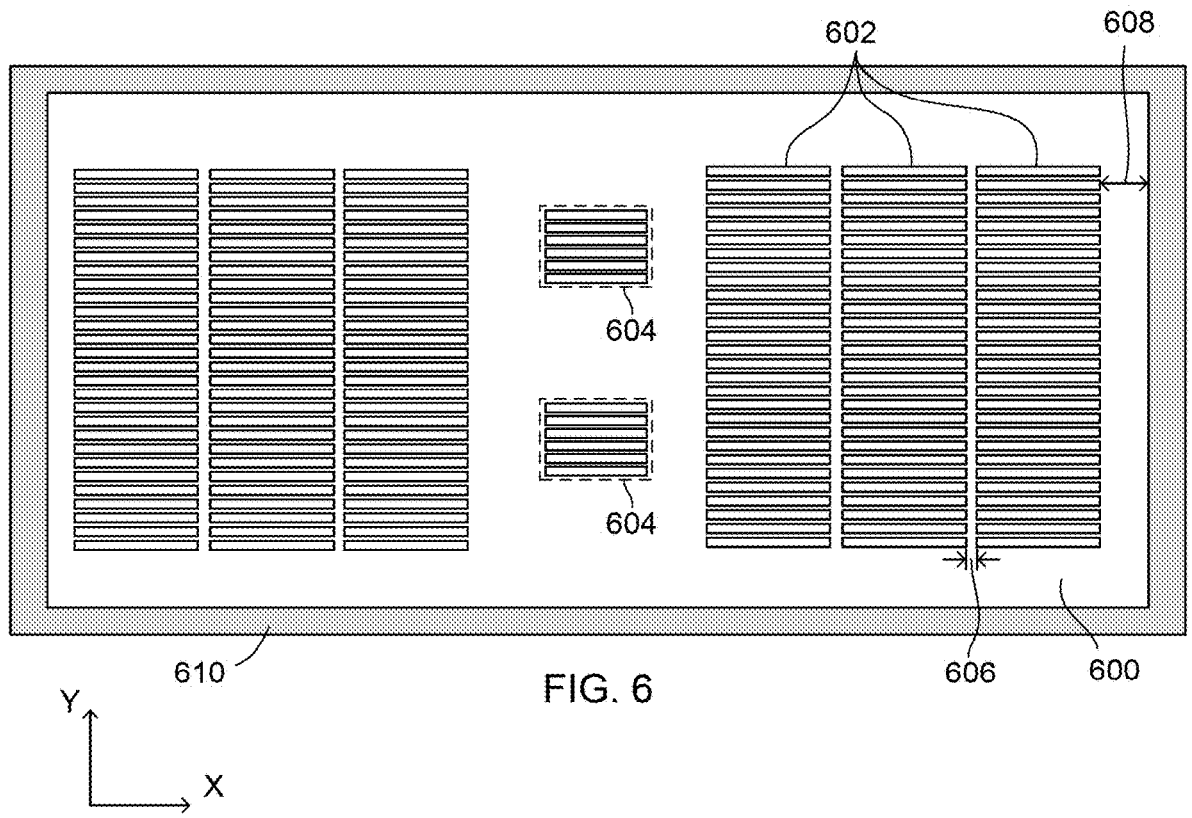
FIG. 6 includes a top view of a portion of a template having an alignment mark in accordance with another embodiment.

FIG. 6 illustrates another embodiment of a template 600 including columns of features 602 and alignment marks 604. As illustrated, a distance 606 between adjacent columns of features 602 is less than a distance 608 between any column of features 602 and a dummy-fill region 610. In a particular embodiment, the distance 606 is at least 0.5 microns, at least 1 micron, or at least 2 microns. In another embodiment, the distance 606 is no greater than 3 microns. In an instance, the distances 606 between adjacent columns of features 602 are equal as compared to one another. In another instance, the distances 606 between adjacent columns of features 602 are not the same. In a particular embodiment, the distance 608 is at least 2 microns or at least 5 microns. In another embodiment, the distance 608 is no greater than 50 microns, no greater than 15 microns, or no greater than 10 microns.

Examples

Marks having traditional boundary conditions and mark constructions are tested against marks as described in accordance with embodiments herein including intra-column gaps and gaps between a dummy-fill region and an entire periphery of the mark. All marks are placed in a single region of a template. Formable material is provided along a substrate and formation of features is performed by urging the template toward the substrate. Filling is conducted independently in both the X- and Y-directions to test for angular filling time differences. Filling is performed until the mark was 100% filled. The duration required to fill the features is measured and recorded.

Sample 1 is a mark having a uniform mark-dummy-fill region gap of 0.5 microns around the entire periphery of the mark. Sample 1 includes no intra-column gaps between adjacent columns of the same mark.

Sample 2 is a mark having a uniform mark-dummy-fill region gap of 5 microns around the entire periphery of the mark. Sample 2 includes an intra-column gap between adjacent columns of the same mark of 2 microns.

TABLE 1

Fill percentages of formable material

| Sample | Fill Orientation | Duration to Fill |
|---|---|---|
| 1 | X | >3.5 seconds |
| 1 | Y | >3.5 seconds |
| 2 | X | <2 seconds |
| 2 | Y | <2 seconds |

As illustrated in Table 1, Sample 1 had a fill time of greater than 3.5 seconds and Sample 2 had a fill time of less than 2 seconds. Sample 2 exhibited a fill time reduction of at least 50% as compared to Sample 1.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An imprint lithography template comprising:
an alignment mark including at least two columns or at least two rows arranged in a direction, wherein each column or each row has a plurality of features extending in the direction; and
a dummy-fill feature, surrounding the at least two columns or at least two rows; and
a locator marker within the dummy-fill feature, wherein the dummy-fill feature comprises a recession, and wherein the plurality of features of the alignment mark is orthogonal to the dummy-fill feature;
wherein the at least two columns or the at least two rows are spaced apart from the dummy-fill feature, wherein a closest distance between the at least two columns or the at least two rows in the direction is less than a closest distance between any portion of the at least two columns or the at least two rows and the dummy-fill feature in the direction, where in a ratio $D_C:D_D$ is between 1:2 and 1:5, where $D_C$ is a distance between the at least two columns or at least two rows, and $D_D$ is a distance between the alignment mark and the dummy-fill feature, and
wherein the distance between the at least two columns or at least two rows is no less than 0.5 microns.

2. The imprint lithography template of claim 1, wherein the alignment mark is disposed within a region of the imprint lithography template that corresponds to a scribe line of a substrate.

3. The imprint lithography template of claim 1, wherein the at least two columns or the at least two rows of features are spaced apart by at least 0.5 microns.

4. The imprint lithography template of claim 1, wherein the closest distance between the at least two columns or the at least two rows of features and the dummy-fill feature is at least 2 microns.

5. The imprint lithography template of claim 1, wherein the dummy-fill feature surrounds the alignment mark.

6. The imprint lithography template of claim 1, wherein the features comprise recessions within the lithography template, wherein the alignment mark further comprises a protrusion, and wherein a portion of the protrusion is disposed between the at least two columns or at least two rows of features and between at least one of the at least two columns or at least two rows of features and the dummy-fill feature.

7. The imprint lithography template of claim 1, wherein the alignment mark further comprises a locator mark including at least one structure having a length lying along a line parallel with a length of at least one of the at least two columns or the at least two rows of features.

8. An imprint lithography system comprising:
a substrate holder adapted to receive a substrate;
a template adapted to translate toward the substrate holder, the template comprising:
an alignment mark including at least two columns or at least two rows spaced apart from each other by at least 0.5 microns in a direction, wherein each column or each row has a plurality of features extending in the direction;
a dummy-fill feature surrounding the alignment mark, wherein the dummy-fill feature comprises a recession, and wherein the at least two columns or at least two rows is orthogonal to the dummy-fill feature; and a locator marker within the dummy-fill feature, wherein a closest spacing between the alignment mark and the dummy-fill feature is at least 2 microns.

9. The imprint lithography system of claim 8, wherein the at least two columns or at least two rows of features are spaced apart from each other by at least 2 microns.

10. The imprint lithography system of claim 8, wherein a closest spacing between the alignment mark and the dummy-fill feature is at least 5 microns.

11. The imprint lithography system of claim 8, wherein the alignment mark further comprises a locator mark including at least one structure having a length lying along a line parallel with a length of at least one of the at least two columns or the at least two rows of features, and wherein the locator mark is disposed within a different portion of a same protrusion of the imprint lithography template as the at least two columns or the at least two rows of features.

12. The imprint lithography system of claim 8, wherein the alignment mark is disposed within a region of the imprint lithography template that corresponds to a scribe line of a substrate.

13. The imprint lithography system of claim 8, wherein a closest distance between the at least two columns or the at least two rows of features is less than a closest distance between any portion of the at least two columns or the at least two rows of features and the dummy-fill feature.

14. The imprint lithography system of claim 8, wherein the at least two columns or at least two rows of features includes three columns spaced apart from one another by at least 1 micron.

\* \* \* \* \*